(12) United States Patent
Horng et al.

(10) Patent No.: US 6,292,336 B1
(45) Date of Patent: Sep. 18, 2001

(54) GIANT MAGNETORESISTIVE (GMR) SENSOR ELEMENT WITH ENHANCED MAGNETORESISTIVE (MR) COEFFICIENT

(75) Inventors: Cheng T. Horng; Ru-Ying Tong, both of San Jose; Kochan Ju, Fremont; Mao-Min Chen, S. J.; Jei-Wei Chang, Cupertino; Simon H. Liao, Fremont, all of CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 09/408,703

(22) Filed: Sep. 30, 1999

(51) Int. Cl.⁷ .................. G11B 5/127; G11B 5/33
(52) U.S. Cl. .................................... 360/324.12
(58) Field of Search .............. 360/324.1, 324.12, 360/316, 324, 313, 324.11, 110, FOR 213

(56) References Cited

U.S. PATENT DOCUMENTS

| | | | |
|---|---|---|---|
| 5,268,806 | 12/1993 | Goubau et al. | 360/43 |
| 5,701,222 | * 12/1997 | Gill et al. | 360/314 |
| 5,701,223 | 12/1997 | Fontana, Jr. et al. | 360/324.11 |
| 5,731,936 | 3/1998 | Lee et al. | 360/327.22 |
| 5,763,108 | 6/1998 | Chang et al. | 428/694 R |
| 5,768,071 | 6/1998 | Lin | 360/324.11 |
| 6,046,892 | * 4/2000 | Aoshima et al. | 360/399 |
| 6,141,191 | * 10/2000 | Lee et al. | 360/324.1 |

* cited by examiner

Primary Examiner—Robert S. Tupper
Assistant Examiner—Julie Anne Watko
(74) Attorney, Agent, or Firm—George O. Saile; Stephen B. Ackerman

(57) ABSTRACT

A method for forming a giant magnetoresistive (GMR) sensor element, and a giant magnetoresistive (GMR) sensor element formed in accord with the method. In accord with the method, there is first provided a substrate. There is then formed over the substrate a seed layer formed of a magnetoresistive (MR) resistivity sensitivity enhancing material selected from the group consisting or nickel-chromium alloys and nickel-iron-chromium alloys. There is then formed over the seed layer a nickel oxide material layer. Finally, there is then formed over the nickel oxide material layer a free ferromagnetic layer separated from a pinned ferromagnetic layer in turn formed thereover by a non-magnetic conductor spacer layer, where the pinned ferromagnetic layer in turn has a pinning material layer formed thereover. The method contemplates a giant magnetoresistive (GMR) sensor element formed in accord with the method. The nickel oxide material layer provides the giant magnetoresistive (GMR) sensor element with an enhanced magnetoresistive (MR) resistivity sensitivity.

20 Claims, 1 Drawing Sheet

GIANT MAGNETORESISTIVE (GMR) SENSOR ELEMENT WITH ENHANCED MAGNETORESISTIVE (MR) COEFFICIENT

CROSS REFERENCE TO RELATED APPLICATIONS

This application is related to co-pending and co-assigned: (1) application Ser. No. 09/236,488, filed Jan. 25, 1999, titled "Giant Magnetoresistive (GMR) Sensor Element With Enhanced Magnetoresistive (MR) Resistivity Sensitivity"; and (2) application Ser. No. 09/408,700, filed on an even date herewith, titled "Anisotropic Magnetoresistive (MR) Sensor Element With Enhanced Magnetoresistive (MR) Coefficient."

BACKGROUND OF THE INVENTION

1. Field of the Invention

The present invention relates generally to magnetoresistive (MR) sensor elements employed within magnetic data storage and retrieval. More particularly, the present invention relates to enhanced magnetoresistive (MR) resistivity sensitivity giant magnetoresistive (GMR) sensor elements employed within magnetic data storage and retrieval.

2. Description of the Related Art

The recent and continuing advances in computer and information technology have been made possible not only by the correlating advances in the functionality, reliability and speed of semiconductor integrated circuits, but also by the correlating advances in the storage density and reliability of direct access storage devices (DASDs) employed in digitally encoded magnetic data storage and retrieval.

Storage density of direct access storage devices (DASDs) is typically determined as areal storage density of a magnetic data storage medium formed upon a rotating magnetic data storage disk within a direct access storage device (DASD) magnetic data storage enclosure. The areal storage density of the magnetic data storage medium is defined largely by the track width, the track spacing and the linear magnetic domain density within the magnetic data storage medium. The track width, the track spacing and the linear magnetic domain density within the magnetic data storage medium are in turn determined by several principal factors, including but not limited to: (1) the magnetic read-write characteristics of a magnetic read-write head employed in reading and writing digitally encoded magnetic data from and into the magnetic data storage medium; (2) the magnetic domain characteristics of the magnetic data storage medium; and (3) the separation distance of the magnetic read-write head from the magnetic data storage medium.

With regard to the magnetic read-write characteristics of magnetic read-write heads employed in reading and writing digitally encoded magnetic data from and into a magnetic data storage medium, it is known in the art of magnetic read-write head fabrication that magnetoresistive M(R) sensor elements employed within magnetoresistive (MR) read-write heads are generally superior to other types of magnetic sensor elements when employed in retrieving digitally encoded magnetic data from a magnetic data storage medium. In that regard, magnetoresistive (MR) sensor elements are generally regarded as superior since magnetoresistive (MR) sensor elements are known in the art to provide high output digital read signal amplitudes, with good linear resolution, independent of the relative velocity of a magnetic data storage medium with respect to a magnetoresistive (MR) read-write head having the magnetoresistive (MR) sensor element incorporated therein.

Within the general category of magnetoresistive (MR) sensor elements, magnetoresistive (MR) sensor elements whose operation is predicated upon a giant magnetoresistive (GMR) effect are presently of considerable interest insofar as those magnetoresistive (MR) sensor elements typically exhibit enhanced levels of magnetoresistive (MR) resistivity sensitivity in comparison with magnetoresistive (MR) sensor elements whose operation is predicated upon magnetoresistive (MR) effects other than the giant magnetoresistive (GMR) effect. The giant magnetoresistive (GMR) effect is understood by a person skilled in the art to be exhibited by a magnetoresistive (MR) sensor element fabricated employing a series of ferromagnetic layers having interposed therebetween a series of non-magnetic conductor spacer layers, where the thicknesses of each non-magnetic conductor spacer layer within the series of non-magnetic conductor spacer layers is chosen such that adjacent ferromagnetic layers within the series of ferromagnetic layers are magnetically coupled and biased anti-parallel.

For purposes of clarity, within the context of the present invention, magnetoresistive (MR) resistivity sensitivity is intended as a measure of proportion of resistance change normalized to an absolute resistance of a magnetoresistive (MR) sensor element (i.e. dR/R) when measuring a magnetic signal within a magnetic data storage medium while employing the magnetoresistive (MR) sensor element. The magnetoresistive (MR) resistivity sensitivity of a magnetoresistive (MR) sensor element is alternatively known as the magnetoresistive (MR) coefficient of the magnetoresistive (MR) sensor element. Magnetoresistive (MR) sensor elements exhibiting enhanced magnetoresistive (MR) resistivity sensitivity are desirable within the art of magnetoresistive (MR) sensor element fabrication since such enhanced magnetoresistive (MR) resistivity sensitivity clearly inherently allows for detection within a magnetic data storage medium of weaker magnetic signals with increased linear density and thus also inherently allows for an increased areal density of the magnetic data storage medium within a magnetic data storage enclosure which employs the magnetoresistive (MR) sensor element which exhibits the enhanced magnetoresistive (MR) resistivity sensitivity.

A typical commercial embodiment of a magnetoresistive (MR) sensor element whose operation is predicated upon the giant magnetoresistive (GMR) effect is a spin valve magnetoresistive (SVMR) sensor element. Spin valve magnetoresistive (SVMR) sensor elements typically employ a pair of ferromagnetic layers separated by a non-magnetic conductor spacer layer, where one ferromagnetic layer within the pair of ferromagnetic layers is additionally magnetically pinned through contact with a hard magnetic material layer to provide a fixed magnetization angle between a first magnetization direction within the magnetically pinned ferromagnetic layer and a second magnetization direction within the other ferromagnetic layer which is un-pinned. The un-pinned other ferromagnetic layer is alternatively referred to as a free ferromagnetic layer. The giant magnetoresistive (GMR) effect within a spin valve magnetoresistive (SVMR) sensor element is predicated upon differential electron scattering trajectories within the spin valve magnetoresistive (SVMR) sensor element incident to magnetic data recording media biasing of a free ferromagnetic layer with respect to a magnetically pinned ferromagnetic layer within the spin valve magnetoresistive (SVMR) sensor element.

It is thus towards the goal of forming for use within magnetic data storage and retrieval giant magnetoresistive (GMR) sensor elements, such as but not limited to spin valve magnetoresistive (SVMR) sensor elements, while forming the giant magnetoresistive (GMR) sensor elements to exhibit enhanced magnetoresistive (MR) resistivity sensitivity, that the present invention is directed.

Various magnetic sensor elements, including but not limited to giant magnetoresistive (GMR) sensor elements, which possess desirable properties have been disclosed within the art of magnetic sensor element fabrication, including but not limited to giant magnetoresistive (GMR) sensor element fabrication.

For example, Goubau et al., in U.S. Pat. No. 5,268,806, disclose a magnetoresistive (MR) sensor element having a conductor lead structure which remains stable not only during processing when fabricating the magnetoresistive (MR) sensor element, but also over the useful operational life of the magnetoresistive (MR) sensor element. The magnetoresistive (MR) sensor element employs a conductor lead structure comprising: (1) a seed layer contacting a magnetoresistive (MR) layer within the magnetoresistive (MR) sensor element, where the seed layer is formed from a material selected from the group consisting of chromium, tungsten, an alloy of titanium and tungsten, and an alloy of tantalum and tungsten, and where the seed layer has a body centered cubic lattice structure; and (2) a conductor layer formed upon the seed layer, where the conductor layer is formed of tantalum and where the conductor layer also has a body centered cubic lattice structure.

In addition, Fontana Jr. et al., in U.S. Pat. No. 5,701,223, disclose a spin valve magnetoresistive (SVMR) sensor element with improved magnetoresistive (MR) properties, such as an enhanced magnetoresistive (MR) resistivity sensitivity, as well as improved chemical properties, such as an enhanced corrosion resistance of an antiferromagnetic pinning material layer within the spin valve magnetoresistive (SVMR) sensor element. The spin valve magnetoresistive (SVMR) sensor element realizes the foregoing objects by employing when forming the spin valve magnetoresistive (SVMR) sensor element: (1) a pair of anti-parallel antiferromagnetically biased ferromagnetic material layers separated by a non-magnetic conductor spacer layer as a composite pinned ferromagnetic layer within the spin valve magnetoresistive (SVMR) sensor element, in conjunction with; (2) a pinning material layer formed of a pinning material selected from the group consisting of nickel oxide, nickel-cobalt alloy oxides and iron-manganese-chromium alloys.

Further, Lee et al., in U.S. Pat. No. 5,731,936, disclose an anisotropic magnetoresistive (MR) sensor element, such as a soft adjacent layer (SAL) magnetoresistive (MR) sensor element, with an enhanced magnetoresistive (MR) resistivity sensitivity as well as an enhanced thermal stability. The anisotropic magnetoresistive (MR) sensor element employs a nickel-iron-chromium alloy or a nickel-chromium alloy spacer layer adjoining a nickel-iron alloy magnetoresistive (MR) layer formed within the anisotropic magnetoresistive (MR) sensor element.

Still further, Chang et al., in U.S. Pat. No. 5,763,108, disclose a high saturation magnetization magnetic material for use when fabricating a magnetic head, and a magnetic head fabricated employing the high saturation magnetization magnetic material for use when fabricating the magnetic head. The high saturation magnetization magnetic material has an elemental composition comprising about 40 to about 60 weight percent iron, about 40 to about 60 weight percent nickel and about 0.002 to about 1 percent tin.

Finally, Lin, in U.S. Pat. No. 5,768,071, discloses a spin valve magnetoresistive (SVMR) sensor element having an improved magnetic stability of a pinned ferromagnetic layer within the spin valve magnetoresistive (SVMR) sensor element. The spin valve magnetoresistive (SVMR) sensor element realizes the foregoing object by employing when forming the spin valve magnetoresistive (SVMR) sensor element a discontinuous nonmagnetic interlayer interposed between an antiferromagnetic pinning material layer and the pinned ferromagnetic layer within the spin valve magnetoresistive (SVMR) sensor element.

Desirable in the art of giant magnetoresistive (GMR) sensor element fabrication are additional methods and materials which may be employed for forming with enhanced magnetoresistive (MR) resistivity sensitivity giant magnetoresistive (MR) sensor elements, including in particular spin valve magnetoresistive (SVMR) sensor elements.

It is towards the foregoing object that the present invention is directed.

SUMMARY OF THE INVENTION

A first object of the present invention is to provide a method for forming a giant magnetoresistive (MR) sensor element, along with the giant magnetoresistive (MR) sensor element formed employing the method.

A second object of the present invention is to provide a method and a giant magnetoresistive (MR) sensor element in accord with the first object of the present invention, where the giant magnetoresistive (MR) sensor element has an enhanced magnetoresistive (MR) resistivity sensitivity.

A third object of the present invention is to provide a method and a giant magnetoresistive (MR) sensor element in accord with the first object of the present invention and the second object of the present invention, which method is readily commercially implemented.

In accord with the objects of the present invention, there is provided by the present invention a method for forming a giant magnetoresistive (MR) sensor element, as well as the giant magnetoresistive (MR) sensor element formed in accord with the method. To practice the method of the present invention, there is first provided a substrate. There is then formed over the substrate a seed layer, where the seed layer is formed of a magnetoresistive (MR) resistivity sensitivity enhancing material selected from the group consisting or nickel-chromium alloys and nickel-iron-chromium alloys. There is then formed over the seed layer a nickel oxide material layer. There is then formed over the nickel oxide material layer a free ferromagnetic layer. There is then formed over the free ferromagnetic layer a non-magnetic conductor spacer layer. There is then formed over the non-magnetic conductor spacer layer a pinned ferromagnetic layer. Finally, there is then formed over the pinned ferromagnetic layer a pinning material layer.

The method of the present invention contemplates a giant magnetoresistive (MR) sensor element fabricated in accord with the method of the present invention.

The present invention provides a method for forming a giant magnetoresistive (MR) sensor element, and the giant magnetoresistive (MR) sensor element formed employing the method, where the giant magnetoresistive (MR) sensor element has an enhanced magnetoresistive (MR) resistivity sensitivity. The method of the present invention realizes the foregoing object by employing when forming the giant magnetoresistive (MR) sensor element: (1) a seed layer formed of a magnetoresistive (MR) resistivity sensitivity enhancing material selected from the group consisting of nickel-chromium alloys and nickel-iron-chromium alloys, in turn having formed thereover; (2) a nickel oxide material layer, in turn having formed thereover; (3) a free ferromagnetic layer separated from a pinned ferromagnetic layer in turn formed thereover by a non-magnetic conductor spacer layer, where the pinned ferromagnetic layer finally in turn has formed thereover; (4) a pinning material layer. While it is not entirely clear why a giant magnetoresistive (GMR) sensor element formed in accord with the present invention exhibits an enhanced magnetoresistive (MR) resistivity sensitivity, it is nonetheless clear that a giant magnetoresistive (GMR) sensor element formed in accord with the present invention exhibits an enhanced magnetoresistive (MR) resistive sensitivity in comparison with an analogous giant magnetoresistive (GMR) sensor formed otherwise in accord with the present invention, but absent a nickel oxide material layer formed interposed between: (1) a seed layer formed of a magnetoresistive (MR) resistivity sensitivity enhancing material selected from the group consisting of nickel-chromium alloys and nickel-iron-chromium alloys; and (2) a free ferromagnetic layer.

The method of the present invention is readily commercially implemented. The present invention employs methods and materials as are generally known in the art of magnetoresistive (MR) sensor element fabrication but employed within the context of specific locations and limitations to provide the present invention. Since it is a novel ordering and use of methods and materials which at least in part provides the present invention, rather than the existence of methods and materials which provides the present invention, the method of the present invention is readily commercially implemented.

BRIEF DESCRIPTION OF THE DRAWING

The objects, features and advantages of the present invention are understood within the context of the Description of the Preferred Embodiment, as set forth below. The Description of the Preferred Embodiment is understood within the context of the accompanying drawing, which forms a material part of this disclosure, wherein.

DESCRIPTION OF THE PREFERRED EMBODIMENT

Figure 1:
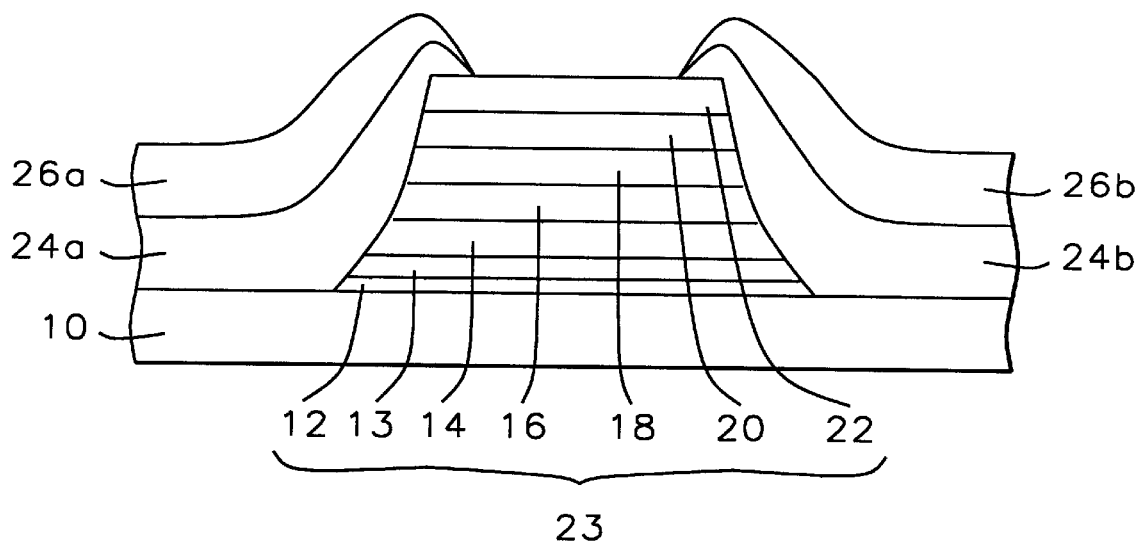
FIG. 1 shows a schematic air bearing surface (ABS) view diagram illustrating a spin valve magnetoresistive (SVMR) sensor element fabricated in accord with a preferred embodiment of the present invention.

The present invention provides a method for forming a giant magnetoresistive (GMR) sensor element, along with the giant magnetoresistive (GMR) sensor element formed in accord with the method, where the giant magnetoresistive (GMR) sensor element has an enhanced magnetoresistive (MR) resistivity sensitivity. The present invention realizes the foregoing object by employing when forming the giant magnetoresistive (GMR) sensor element: (1) a seed layer formed of a magnetoresistive (MR) resistivity sensitivity enhancing material selected from the group consisting of nickel-chromium alloys and nickel-iron-chromium alloys, over which is formed; (2) a nickel oxide material layer, over which is formed; (3) a free ferromagnetic layer separated from a pinned ferromagnetic layer in turn formed thereover by a non-magnetic conductor spacer layer, where the pinned ferromagnetic layer in turn finally has formed thereover; (4) a pinning material layer.

Although the preferred embodiment of the present invention illustrates the present invention within the context of fabricating a simple spin valve magnetoresistive (SVMR) sensor element which may be employed within digitally encoded magnetic data storage and retrieval while employing a direct access storage device (DASD) magnetic data storage enclosure, the present invention may also be employed for forming with enhanced magnetoresistive (MR) resistivity sensitivity giant magnetoresistive (GMR) sensor elements including but not limited to simple spin valve magnetoresistive (SVMR) sensor elements, synthetic antiferromagnetically biased giant magnetoresistive (GMR) sensor elements, simple spin filter giant magnetoresistive (GMR) sensor elements and spin filter synthetic antiferromagnetically biased giant magnetoresistive (GMR) sensor elements employed within: (1) digitally encoded magnetic data storage and transduction applications other than those employing direct access storage device (DASD) magnetic data storage enclosures; as well as (2) various analog magnetic data storage and transduction applications.

Referring now to FIG. 1, there is shown a schematic air bearing surface (ABS) view diagram illustrating a simple spin valve magnetoresistive (SVMR) sensor element fabricated in accord with a preferred embodiment of the present invention.

Shown in FIG. 1 is a substrate 10 having formed thereover, among other layers, a seed layer 12, which in turn has formed thereupon a nickel oxide material layer 13, which in turn has formed thereupon a free ferromagnetic layer 14 Within the preferred embodiment of the present invention with respect to the substrate 10, the seed layer 12, the nickel oxide material layer 13 and the free ferromagnetic layer 14, each of the substrate 10, the seed layer 12, the nickel oxide material layer 13 and the free ferromagnetic layer 14 may be formed employing methods and materials as are either generally known or conventional in the art of magnetoresistive (MR) sensor element fabrication, although, as discussed below, some aspects of the nickel oxide material layer 13 are presumably neither generally known nor conventional in the art of magnetoresistive (MR) sensor element fabrication.

For example, although it is known in the art of magnetoresistive (MR) sensor element fabrication that substrates are typically formed from non-magnetic ceramic materials such as but not limited to oxides, nitrides, borides and carbides, as well as homogeneous and heterogeneous mixtures of oxides, nitrides, borides and carbides, for the preferred embodiment of the present invention, the substrate 10 is preferably formed from a non-magnetic aluminum oxide-titanium carbide ceramic material, where the upper surface of the substrate 10, although not specifically illustrated within the schematic cross-sectional diagram of FIG. 1, typically and preferably has formed thereupon and thus incorporated therein a dielectric layer, typically and preferably (although not exclusively) formed of an aluminum oxide material, upon which dielectric layer is formed the seed layer 12. Preferably, the substrate 10 so formed is formed with sufficient dimensions to allow the substrate 10 to be fabricated into a slider employed within a direct access storage device (DASD) magnetic data storage enclosure employed within digitally encoded magnetic data storage and retrieval, although, as noted above, a giant magnetoresistive (GMR) sensor element fabricated in accord with the present invention, such as the simple spin-valve magnetoresistive (MR) sensor element fabricated in accord with the preferred embodiment of the present invention, may be employed within other digitally encoded magnetic data storage and transduction applications, as well as analog magnetic data storage and transduction applications.

Specifics of fabrication of a giant magnetoresistive (GMR) sensor element, such as the spin-valve magnetoresistive (SVMR) sensor element of the preferred embodiment of the present invention, into a direct access storage device (DASD) magnetic data storage enclosure employed within digitally encoded magnetic data storage and retrieval are generally conventional in the art of direct access storage device (DASD) magnetic data storage enclosure fabrication and are thus not provided here. Such details may be found, however, within various portions of the prior art references cited within the Description of the Related Art, all of the teachings of which prior art references are incorporated herein fully by reference.

Within the preferred embodiment of the present invention with respect to the seed layer 12, the seed layer 12 is formed of a material which enhances the magnetoresistive (MR) resistivity sensitivity of the spin valve magnetoresistive (SVMR) sensor element whose schematic air bearing surface (ABS) view diagram is illustrated within FIG. 1. Within the preferred embodiment of the present invention, it has similarly been determined experimentally that the seed layer 12 is preferably formed of either: (1) a nickel-iron-chromium alloy of nickel:iron:chromium weight ratio from about 56:14:30 to about 40:10:50, more preferably from about 53:12:35 to about 44:11:45; or (2) a nickel-chromium alloy of nickel:chromium weight ratio from about 40:60 to about 60:40, more preferably from about 45:55 to about 55:45, under conditions where at least a portion of the free ferromagnetic layer 14 which is closer to the seed layer 12 is preferably formed of a nickel-iron (permalloy) alloy of nickel:iron weight ratio from about 70:30 to about 90:10, more preferably from about 77:23 to about 85:15. Typically and preferably, the seed layer 12 is formed to a thickness of from about 30 to about 100 angstroms.

Within the preferred embodiment of the present invention, the portion of the free ferromagnetic layer 14 which is closer to the seed layer 12, or alternatively the free ferromagnetic layer 14 in its entirety, may also be formed of other ferromagnetic materials (in place of the nickel-iron (permalloy) alloys whose compositions are noted above) while still providing enhanced magnetoresistive (MR) resistivity sensitivity of the spin-valve magnetoresistive (SVMR) sensor element whose schematic air bearing surface (ABS) view diagram is illustrated in FIG. 1. Such other ferromagnetic materials which may be employed for forming the free ferromagnetic layer 14 may include but are not limited to nickel ferromagnetic materials, iron ferromagnetic materials, cobalt ferromagnetic materials, alloys thereof, laminates thereof and laminates of alloys thereof, which have compositions such that lattice parameters of the seed layer 12 and portion of the free ferromagnetic layer 14 which is closer to the seed layer 12 are closely approximate or match.

Within the preferred embodiment of the present invention with respect to the nickel oxide material layer 13, the nickel oxide material layer 13 may be formed employing methods as are known in the art of magnetoresistive (MR) sensor element fabrication to provide a nickel oxide material layer which is particularly thin, preferably in a range of from about 5 to about 15 angstroms. Such methods may include, but are not limited to chemical vapor deposition (CVD) methods and physical vapor deposition (PVD) sputtering methods. It is believed within the present invention that such a particularly thin nickel oxide material layer is, in comparison with antiferromagnetic dielectric nickel oxide material layers formed to substantially greater thicknesses of generally at least about 200 angstroms, formed instead as a nonmagnetic dielectric nickel oxide material layer. It is further believed that such a particularly thin nonmagnetic dielectric nickel oxide material layer in accord with the present invention and preferred embodiment of the present invention provides for enhanced specular electron scattering within a giant magnetoresistive (GMR) sensor element, such as the spin-valve magnetoresistive (SVMR) sensor element in accord with the preferred embodiment of the present invention, and consequently thus also provides an additional enhancement to a magnetoresistive (MR) resistivity sensitivity of a giant magnetoresistive (GMR) sensor element fabricated in accord with the present invention.

More preferably, within the preferred embodiment of the present invention, the nickel oxide material layer 13 formed to the thickness of from about 5 to about 15 angstroms is formed employing a reactive radio frequency sputtering method employing a nickel target and an argon/oxygen mixture sputtering atmosphere. Preferably, the reactive radio frequency sputtering method also employs: (1) a reactor chamber pressure of about 5 to about 15 mtorr; (2) a source radio frequency power of from about 200 to about 500 watts at a source radio frequency of 13.56 MHZ, and a substrate bias voltage of about 30 volts; (3) an argon/oxygen mixture flow rate of from about 50 to about 100 standard cubic centimeters per minute (sccm); and (4) an oxygen content within the argon/oxygen mixture of from about 4 to about 12 volume percent, to provide the nickel oxide material layer 13 of nickel:oxygen atomic ratio of from about 0.8:1.0 to about 1.0:0.8.

Within the preferred embodiment of the present invention with respect to the free ferromagnetic layer 14, beyond the preference as disclosed above that at least a portion of the free ferromagnetic layer 14 close to the seed layer 12 is preferably formed of a nickel-iron (permalloy) alloy ferromagnetic material (or the enumerated alternative ferromagnetic materials, provided similarity of lattice parameters), the free ferromagnetic layer 14 may, as noted above, otherwise be formed of a ferromagnetic material, or an aggregate of ferromagnetic materials, as is conventionally employed for forming free ferromagnetic layers and pinned ferromagnetic layers within spin-valve magnetoresistive (SVMR) sensor elements as are conventional in the art of spin-valve magnetoresistive (SVMR) sensor element fabrication. Such ferromagnetic materials typically include, but are not limited to nickel ferromagnetic materials, iron ferromagnetic materials and cobalt ferromagnetic materials, as well as alloys thereof, laminates thereof and laminates of alloys thereof For the preferred embodiment of the present invention, the free ferromagnetic layer 14 is preferably formed of a laminate of: (1) the nickel-iron alloy layer, of composition as described above and of thickness from about 20 to about 100 angstroms formed upon the nickel oxide material layer 13; and (2) either a cobalt layer or a cobalt-iron alloy layer of up to about 20 weight percent iron, more preferably from about 5 to about 15 weight percent iron, either of the foregoing layers having a thickness from about 5 to about 20 angstroms, formed upon the nickel-iron alloy layer. Within the preferred embodiment of the present invention the cobalt or cobalt-iron alloy layer is believed to: (1) improve spin dependent scattering within the spin valve magnetoresistive (SVMR) sensor element whose schematic air bearing surface (ABS) view diagram is illustrated in FIG. 1; and (2) prevent interdiffusion between the nickel-iron alloy layer and a non-magnetic conductor spacer layer formed upon the free ferromagnetic layer 14 within the spin-valve magnetoresistive (MR) sensor element whose schematic air bearing surface (ABS) view diagram is illustrated in FIG. 1.

Shown also within the spin valve magnetoresistive (SVMR) sensor element whose schematic air bearing surface (ABS) view diagram is illustrated within FIG. 1 is: (1) a non-magnetic conductor spacer layer 16 formed upon the free ferromagnetic layer 14; (2) a pinned ferromagnetic layer 18 formed upon the non-magnetic conductor spacer layer 16; (3) a pinning material layer 20 formed upon the pinned ferromagnetic layer 18; and (4) a cap layer 22 formed upon the pinning material layer 20, where the preceding four layers, in conjunction with the seed layer 12, the nickel oxide material layer 13 and the free ferromagnetic layer 14, form a spin valve magnetoresistive (SVMR) stack layer 23. Finally, there is also shown within FIG. 1: (1) a pair of patterned longitudinal magnetic biasing layers 24a and 24b formed encapsulating a pair of opposite edges of the spin valve magnetoresistive (SVMR) stack layer 23; and (2) a pair of patterned conductor lead layers 26a and 26b formed and aligned upon the pair of patterned longitudinal magnetic biasing layers 24a and 24b in a fashion which defines a trackwidth of the spin valve magnetoresistive (SVMR) stack layer 23 Each of the foregoing layers may be formed employing methods and materials as are conventional in the art of spin valve magnetoresistive (SVMR) sensor element fabrication.

For example, although it is known in the art of spin valve magnetoresistive (SVMR) sensor element fabrication that non-magnetic conductor spacer layers may be formed from non-magnetic conductor materials including but not limited to copper, gold and silver non-magnetic conductor materials, as well as alloys thereof, laminates thereof and laminates of alloys thereof, for the preferred embodiment of the present invention, the non-magnetic conductor spacer layer 16 is preferably formed of a copper non-magnetic conductor material, formed upon the free ferromagnetic layer 14 to a thickness of from about 20 to about 30 angstroms.

In addition, although it is also known in the art of spin valve magnetoresistive (SVMR) sensor element fabrication that pinned ferromagnetic layers may be formed of ferromagnetic materials analogous or equivalent to the ferromagnetic materials employed for forming free ferromagnetic layers within spin valve magnetoresistive (SVMR) sensor elements, such ferromagnetic materials being selected from the group of ferromagnetic materials including but not limited to nickel ferromagnetic materials, iron ferromagnetic materials and cobalt ferromagnetic materials, as well as alloys thereof, laminates thereof, and laminates of alloys thereof, for the preferred embodiment of the present invention, the pinned ferromagnetic layer 18 is preferably formed of either a cobalt layer or a cobalt-iron alloy layer of up to about 20 weight percent iron, more preferably of up to about 10 weight percent iron, formed to a thickness of from about 10 to about 30 angstroms upon the non-magnetic conductor spacer layer 16.

Similarly, within the preferred embodiment of the present invention with respect to the pinning material layer 20, although it is known in the art of spin valve magnetoresistive (SVMR) sensor element fabrication that pinning material layers may be formed of hard magnetic pinning materials including but not limited to: (1) antiferromagnetic hard magnetic pinning materials (such as but not limited to iron-manganese alloy antiferromagnetic hard magnetic pinning materials, nickel-manganese alloy antiferromagnetic hard magnetic pinning materials, platinum-manganese alloy antiferromagnetic hard magnetic pinning materials, iridium-manganese alloy antiferromagnetic hard magnetic pinning materials and higher order alloys incorporating iron-manganese alloy antiferromagnetic hard magnetic pinning materials, nickel-manganese alloy antiferromagnetic hard magnetic pinning materials, platinum-manganese alloy antiferromagnetic hard magnetic pinning materials and iridium-manganese alloy antiferromagnetic hard magnetic pinning materials); as well as (2) permanent magnet hard magnetic pinning materials (such as but not limited to cobalt-platinum permanent magnet hard magnetic pinning materials and higher order alloys incorporating cobalt-platinum permanent magnet hard magnetic pinning materials), for the preferred embodiment of the present invention, the pinning material layer 20 is preferably formed of a platinum-manganese alloy antiferromagnetic hard magnetic pinning material of platinum:manganese weight ratio from about 60:40 to about 40:60, formed to a thickness of from about 150 to about 300 angstroms upon the pinned ferromagnetic layer 18.

Yet similarly, within the preferred embodiment of the present invention with respect to the cap layer 22, it is known in the art of spin-valve magnetoresistive (SVMR) sensor element fabrication that cap layers may be formed of non-magnetic conductor materials generally analogous to the non-magnetic conductor materials employed for forming non-magnetic conductor spacer layers within spin valve magnetoresistive (SVMR) sensor elements, but where such cap layers are generally formed of non-magnetic conductor materials of higher resistivity in order to limit current shunting through the cap layer. Such non-magnetic conductor materials of higher resistivity include, but are not limited to, tantalum conductor materials. Thus, for the preferred embodiment of the present invention the cap layer 22 is preferably formed of a tantalum non-magnetic conductor material formed to a thickness of from about 30 to about 100 angstroms upon the pinning material layer 20. Within the present invention, the cap layer 22 may alternatively be formed of a material analogous or equivalent to a material from which is formed the seed layer 12.

Although the cap layer 22 is optional within the spin valve magnetoresistive (SVMR) sensor element whose schematic air bearing surface (ABS) view diagram is illustrated in FIG. 1, the cap layer 22 typically provides a barrier which impedes environmental degradation of underlying layers within the spin valve magnetoresistive (SVMR) sensor element whose schematic air bearing surface (ABS) view diagram is illustrated in FIG. 1.

Finally, within the preferred embodiment of the present invention with respect to the pair of patterned longitudinal magnetic biasing layers 24a and 24b having formed and aligned thereupon the pair of patterned conductor lead layers 26a and 26b, the pair of patterned longitudinal magnetic biasing layers 24a and 24b is typically and preferably formed to a thickness of from about 200 to about 400 angstroms each while employing hard magnetic materials analogous or equivalent to the hard magnetic materials employed for forming the pinning material layer 20, along with optional appropriate seed layers. Similarly, the patterned conductor lead layers 26a and 26b may be formed employing conductor lead materials as are conventional in the art of spin-valve magnetoresistive (SVMR) sensor element fabrication, such conductor lead materials including but not limited to gold, gold alloy, silver, silver alloy, copper and copper alloy conductor lead materials. For the preferred embodiment of the present invention, each patterned conductor lead layer 26a or 26b within the pair of patterned conductor lead layers 26a and 26b is preferably formed of a gold and tantalum laminated conductor lead material, preferably formed to a thickness of from about 200 to about 800 angstroms, while encapsulating the pair of opposite edges of the spin-valve magnetoresistive (SVMR) stack layer 23 as illustrated within the schematic cross-sectional diagram of FIG. 1 and defining the trackwidth of the spin-valve magnetoresistive (SVMR) sensor element whose schematic air bearing surface (ABS) view diagram is illustrated in FIG. 1 of from about 0.5 to about 1.5 microns.

Upon forming the spin valve magnetoresistive (SVMR) sensor element whose schematic air bearing surface (ABS) view diagram is illustrated in FIG. 1, there is formed a spin valve magnetoresistive (SVMR) sensor element with an enhanced magnetoresistive (MR) resistivity sensitivity. The spin valve magnetoresistive (SVMR) sensor element exhibits the enhanced magnetoresistive (MR) resistivity sensitivity since there is employed when fabricating the spin valve magnetoresistive (SVMR) sensor element: (1) a seed layer formed of a magnetoresistive (MR) resistivity sensitivity enhancing material selected from the group consisting of nickel-chromium alloys and nickel-iron-chromium alloys, in turn having formed thereupon; (2) a nickel oxide material layer, in turn having formed thereupon; (3) a free ferromagnetic layer formed of a magnetoresistive (MR) ferromagnetic material within the spin-valve magnetoresistive (SVMR) sensor element.

Although not specifically illustrated within the schematic air bearing surface (ABS) view diagram of FIG. 1, to be fully operational, the spin valve magnetoresistive (SVMR) sensor element whose schematic air bearing surface (ABS) view diagram is illustrated within FIG. 1 must have magnetization directions of the free ferromagnetic layer 14 and the pinned ferromagnetic layer 18 fixed with respect to each other, typically and preferably in orthogonal directions. Typically and preferably, the magnetization direction of the free ferromagnetic layer 14 will be parallel to the plane of the air bearing surface (ABS) of the spin valve magnetoresistive (SVMR) sensor element whose schematic air bearing surface (ABS) view diagram is illustrated within FIG. 1 and coincide with the long axis of the free ferromagnetic layer 14. Similarly, typically and preferably, the magnetization direction of the pinned ferromagnetic layer 18 will be perpendicular to the plane of air bearing surface (ABS) of the spin valve magnetoresistive (SVMR) sensor element whose schematic air bearing surface (ABS) view diagram is illustrated in FIG. 1. Such magnetization directions may be obtained employing magnetically assisted thermal annealing methods (at temperatures of up to about 280 degrees centigrade for time periods of up to about 5 hours) and magnetically assisted deposition methods as are conventional in the art of spin-valve magnetoresistive (SVMR) sensor element fabrication.

As is understood by a person skilled in the art, the spin valve magnetoresistive (SVMR) sensor element whose schematic air bearing surface (ABS) view diagram is illustrated in FIG. 1 may be further fabricated employing layers and structures as are conventional in the art of spin valve magnetoresistive (SVMR) sensor element fabrication to provide a spin valve magnetoresistive (SVMR) sensor element which is fully functional within a magnetic data storage and transduction application within which is employed the spin valve magnetoresistive (SVMR) sensor element. Such additional layers and structures may include, but are not limited shield layers and structures, passivation layers and structures, conductor contact layers and structures and inductive magnetic write pole layers and structures. Resulting from such additional layers and structures fabricated incorporating the spin valve magnetoresistive (SVMR) sensor element whose schematic air bearing surface (ABS) view diagram is illustrated within FIG. 1 may be a magnetic head selected from the group including but not limited to magnetoresistive (MR) read only magnetic heads, merged inductive write magnetoresistive (MR) read magnetic heads (which employ a pertinent magnetic material layer as both a shield layer for isolating a spin valve magnetoresistive (MR) sensor element within the merged inductive write magnetoresistive (MR) read magnetic head and as a magnetic inductor write pole layer within the merged inductive write magnetoresistive (MR) read magnetic head), and non-merged inductive magnetic write magnetoresistive (MR) read magnetic heads.

Similarly, in concert with that which is noted above, the present invention is not limited to forming with an enhanced magnetoresistive (MR) resistivity sensitivity only a spin valve magnetoresistive (SVMR) sensor element, but may also be employed for forming with enhanced magnetoresistive (MR) resistivity sensitivity giant magnetoresistive (GMR) sensor elements including but not limited to simple spin valve magnetoresistive (SVMR) sensor elements, synthetic antiferromagnetically biased giant magnetoresistive (GMR) sensor elements, simple spin filter giant magnetoresistive (GMR) sensor elements and spin filter synthetic antiferromagnetically biased giant magnetoresistive (GMR) sensor elements.

For example and without limitation, such a synthetic antiferromagnetically biased giant magnetoresistive (GMR) sensor element may be fabricated employing methods and materials analogous or equivalent to the methods and materials employed for forming the simple spin valve magnetoresistive (SVMR) sensor element in accord with the preferred embodiment of the present invention but wherein the pinned ferromagnetic material layer is a trilayer comprising a pair of cobalt-iron alloy ferromagnetic material layers separated by an non-magnetic conductor spacer layer, such as but not limited to a ruthenium non-magnetic conductor spacer layer of thickness from about 5 to about 9 angstroms. An explicit, but not limiting, example of materials layering within such a synthetic giant magnetoresistive (GMR) sensor element is as follows: NiFeCr/NiO/NiFe+CoFe/Cu/CoFe/Ru/CoFe/PtMn.

Similarly, also for example and without limitation, such a simple spin filter giant magnetoresistive (GMR) sensor element may be fabricated employing methods and materials analogous or equivalent to the methods and materials employed for forming the simple spin valve magnetoresistive (SVMR) sensor element in accord with the preferred embodiment of the present invention, but wherein there is formed interposed between the nickel oxide material layer and the free ferromagnetic material layer an additional non-magnetic conductor layer, such as a copper non-magnetic conductor layer, formed to a thickness of from about 5 to about 15 angstroms. An explicit, but not limiting, example of materials layering within such a spin filter giant magnetoresistive (GMR) sensor element is as follows: NiFeCr/NiO/Cu/CoFe/Cu/CoFe/PtMn.

Finally, also for example and without limitation, such a spin filter synthetic antiferromagnetically biased giant magnetoresistive (GMR) sensor element may be formed employing methods, materials and dimensions analogous or equivalent to the methods, materials and dimensions employed for forming the simple spin valve magnetoresistive (SVMR) sensor element in accord with the preferred embodiment of the present invention, but wherein there is incorporated therein the additional layers as are characterized by both the synthetic antiferromagnetically biased giant magnetoresistive (GMR) sensor element and the simple spin filter giant magnetoresistive (GMR) sensor element as noted above. An explicit, but not limiting, example of materials layering within such a spin-filter/synthetic giant magnetoresistive (GMR) sensor element is as follows: NiFeCr/NiO/Cu/CoFe/Cu/CoFe/Ru/CoFe/PtMn.

Under such circumstances, and in accord with the preferred embodiment of the present invention, such other giant magnetoresistive (GMR) sensor elements with enhanced magnetoresistive (MR) resistivity sensitivity are fabricated in accord with the present invention by employing: (1) a seed layer of a magnetoresistive (MR) resistivity sensitivity enhancing material selected from the group consisting of nickel-chromium alloys and nickel-iron-chromnium alloys, in turn having formed thereupon; (2) a nickel oxide material layer, further in turn having formed thereover, (3) a free ferromagnetic layer.

Finally, while the spin valve magnetoresistive (SVMR) sensor element in accord with the preferred embodiment of the present invention is illustrated as having each of the pertinent seed layer 12, nickel oxide material layer 13 and free ferromagnetic layer 14 as a stack of layers one formed upon the other, more generally, within a giant magnetoresistive (GMR) sensor element formed in accord with the present invention, corresponding layers may be formed over each other rather than necessarily upon each other. Such layers when formed over each other may have formed interposed therebetween additional layers, such as is illustrated, for example and without limitation, by one of the copper layers within the simple spin filter giant magnetoresistive (GMR) sensor element or the spin filter synthetic antiferromagnetically biased giant magnetoresistive (GMR) sensor element as is disclosed above.

EXAMPLES

There was obtained two aluminum oxide-titanium carbide substrates employed for fabricating magnetoresistive (MR) sensor elements. Each of the two aluminum oxide-titanium carbide substrates had formed thereupon an aluminum oxide dielectric layer of thickness about 3 microns.

There was formed upon the aluminum oxide dielectric layer formed upon a first of the two aluminum oxide-titanium carbide substrates a first magnetoresistive (MR) stack layer comprising: (1) a seed layer formed to a thickness of about 40 angstroms upon the aluminum oxide dielectric layer from a nickel-iron-chromium alloy of nickel:iron:chromium weight ratio about 48:12:40 while employing a magnetron sputtering method; (2) a nickel oxide material layer of thickness about 10 angstroms formed upon the seed layer from a nickel oxide material of nickel:oxygen atomic ratio about 1:1 formed employing a reactive sputtering of a nickel target in an argon\oxygen mixture of about 6 volume percent oxygen; (3) a ferromagnetic material layer formed to a thickness of about 65 angstroms upon the nickel oxide material layer from a nickel-iron alloy of nickel:iron weight ratio about 80:20 also formed while employing a magnetron sputtering method.

There was formed upon the aluminum oxide dielectric layer formed upon a second of the two aluminum oxide-titanium carbide substrates a second magnetoresistive (MR) stack otherwise equivalent to the first magnetoresistive (MR) stack layer, but without the nickel oxide material layer formed interposed between the seed layer and the ferromagnetic material layer.

Upon each of the first magnetoresistive (MR) stack layer formed upon the first aluminum oxide-titanium carbide substrate and the second magnetoresistive (MR) stack layer formed upon the second aluminum oxide-titanium carbide substrate there was then formed a pair of patterned antiferromagnetic longitudinal magnetic biasing layers of a platinum-manganese alloy of thickness about 250 angstroms, in turn having formed thereupon a pair of patterned conductor lead layers.

Each of the two aluminum oxide-titanium carbide substrates was then thermally annealed at a temperature of about 280 degrees centigrade for a time period of about 2.5 hours in an extrinsic magnetic bias field of about 2000 oersteds to fully align the patterned antiferromagnetic longitudinal magnetic biasing layers and the ferromagnetic material layers along a long axis.

There was then determined while employing conventional magnetization versus magnetic field measurements (i.e. hysteresis curve measurements), as well as other electrostatic measurements, various magnetic and electrical properties of the two magnetoresistive (MR) stack layers. The properties included: (1) saturation magnetization (Bs); (2) coercivity field (Hc); (3) anisotropy field (Hk); (4) sheet resistance (Rs); (5) magnetostriction ($\lambda$s); (6) magnetoresistive (MR) resistivity sensitivity (dR/R); (7) a figure of merit (equal to sqrt(Rs)*(dR/R)/Bs); and (8) a figure of merit improvement. Values for the above measured and calculated properties are reported in Table I, as follows.

TABLE I

|  | MR Stack w/ NiOx | MR Stack w/o NiOx |
|---|---|---|
| Saturation Magnetization, Bs (emu) | 0.521 | 0.537 |
| Coercivity, Hc (oersteds) | 1.85 | 1.49 |
| Anisotropy Field, Hk (oersteds) | 3.97 | 3.57 |
| Sheet Resistance, Rs (ohms/sq) | 29.24 | 33.34 |
| Magnetostriction, $\lambda$s | −5.0E−6 | −1.7E−6 |
| Resistivity Sensitivity, dR/R (percent) | 2.63 | 2.23 |
| Figure of Merit, sqrt(Rs) * (dR/R)/Bs | 0.273 | 0.240 |
| Figure of Merit Improvement (percent) | 13.8 | control |

As is seen from review of the data reported within Table I, there is observed a significant increase in magnetoresistive (MR) resistivity sensitivity for a magnetoresistive (MR) stack layer formed in accord with the present invention, as well as figure of merit and figure of merit improvement for such a magnetoresistive (MR) stack layer, in comparison with an otherwise equivalent magnetoresistive (MR) stack layer absent a nickel oxide material layer formed interposed between and contacting: (1) a seed layer formed of a magnetoresistive (MR) resistivity sensitivity enhancing material selected from the group consisting of nickel-chromium alloys and nickel-iron chromium alloys; and (2) a ferromagnetic layer.

As is understood by a person skilled in the art, the preferred embodiment and examples of the present invention are illustrative of the present invention rather than limiting of the present invention. Revisions and modification may be made to methods, materials, structures and dimensions employed for forming a giant magnetoresistive (GMR) sensor element, such as but not limited to a spin-valve magnetoresistive (SVMR) sensor element in accord with the preferred embodiment of the present invention, while still providing a giant magnetoresistive (GMR) sensor element in accord with the spirit and scope of the present invention, as defined by the appended claims.

What is claimed is:

1. A method for forming a fiant magnetoresistive (GMR) sensor element with an enhanced magnetoresistive coefficient comprising:

provided a substrate;

forming over the substrate a double-layer said double layer comprising a first material layr selected from the group of magnetoresistive (MR) resistivity sensitivity enhancing material consisting of nickel-chromium alloys and nickel-iron-chromium alloys and said double-layer seed layer further comprising a second material layer, said material layer being a thin, non-magnetic dielectric nickel oxide material layer that additionally enhances magnetoresistive (MR) resistivity sensitivity;

2. The method of claim 1 wherein the giant magnetoresistive (GMR) sensor element is selected from the group consisting of simple spin valve magnetoresistive (SVMR) sensor elements, synthetic antiferromagnetically biased giant magnetoresistive (GMR) sensor elements, simple spin filter giant magnetoresistive (GMR) sensor elements and spin filter synthetic antiferromagnetically biased giant magnetoresistive (GMR) sensor elements.

3. The method of claim 1 wherein the nickel oxide material layer, which is the second material layer of said double-layer seed layer, is formed to a thickness of from about 5 to about 15 angstroms as a non-magnetic dielectric nickel oxide material layer.

4. The method of claim 1 wherein the free ferromagnetic material layer and the pinned ferromagnetic material layer are each formed of a ferromagnetic material selected from the group consisting of nickel, iron and cobalt ferromagnetic materials, alloys thereof, laminates thereof and laminates of alloys thereof.

5. A giant magnetoresistive (GMR) sensor element with an enhanced magnetoresistive coefficient comprising:

a substrate;

a double-layer seed layer formed over the substrate, said double layer comprising a first material layer selected from the group of magnetoresistive (MR) resistivity sensitivity enhancing material consisting of nickel-chromium alloys and nickel-iron-chromium alloys and said double-layer seed layer further comprising a second material layer, said material layer being a thin, non-magnetic dielectric nickel oxide material layer that additionally enhances magnetoresistive (MR) resistivity sensitivity;

a free ferromagnetic layer formed over the double-layer seed layer;

a non-magnetic conductor spacer layer formed over the free ferromagnetic layer;

a pinned ferromagnetic layer formed over the non-magnetic conductor spacer layer; and a pinning material layer formed over the pinned ferromagnetic layer.

6. The giant magnetoresistive (GMR) sensor element of claim 5 wherein the giant magnetoresistive (GMR) sensor element is selected from the group consisting of simple spin valve magnetoresistive (SVMR) sensor elements, synthetic antiferromagnetically biased giant magnetoresistive (GMR) sensor elements, simple spin filter giant magnetoresistive (GMR) sensor elements and spin filter synthetic antiferromagnetically biased giant magnetoresistive (GMR) sensor elements.

7. The giant magneteresistive (GMR) sensor element of claim 5 wherein the nickel oxide material layer, which is the second material layer of said double-layer seed layer, is formed to a thickness of from about 5 to about 15 angstroms as a non-magnetic dielectric nickel oxide material layer.

8. The giant magnetoresistive (GMR) sensor element of claim 5 wherein the free ferromagnetic material layer and the pinned ferromagnetic material layer are each formed of a ferromagnetic material selected from the group consisting of nickel, iron and cobalt ferromagnetic materials, alloys thereof, laminates thereof and laminates of alloys thereof.

9. A magnetoresistive (MR) head having incorporated therein a giant magnetoresistive (GMR) sensor element in accord with claim 5.

10. The magnetoresistive (MR) head of claim 9 wherein the magnetoresistive (MR) head is selected from the group consisting of magnetoresistive (MR) read only magnetic heads, merged inductive write magnetoresistive (MR) read magnetic heads and non-merged inductive write magnetoresistive (MR) read magnetic heads.

11. A magnetic data storage enclosure having incorporated therein a magnetoresistive (MR) head in accord with claim 9.

12. A method for forming a spin valve magnetoresistive (SVMR) sensor element with an enhanced magnetoresistive coefficient comprising:

providing a substrate;

forming over the substrate a double-layer seed layer, said double layer comprising a first material layer selected from the group of magnetoresistive (MR) resistivity sensitivity enhancing material consisting of nickel-chromium alloys and nickel-iron-chromium alloys and said double-layer seed layer further comprising a second material layer, said material layer being a thin, non-magnetic dielectric nickel oxide material layer that additionally enhances magnetoresistive (MR) resistivity sensitivity;

forming over the double-layer seedlayer a free ferromagnetic layer;

forming over the free ferromagnetic layer a non-magnetic conductor spacer layer;

forming over the non-magnetic conductor spacer layer a pinned ferromagnetic layer; and forming over the pinned ferromagnetic layer a pinning material layer.

13. The method of claim 12 wherein the nickel oxide material layer, which is the second material layer of said double-layer seed layer, is formed to a thickness of from about 5 to about 15 angstroms as a non-magnetic dielectric nickel oxide material layer.

14. The method of claim 12 wherein the free ferromagnetic layer and the pinned ferromagnetic layer are each formed of a ferromagnetic material selected from the group consisting of nickel, iron and cobalt ferromagnetic materials, alloys thereof, laminates thereof and laminates of alloys thereof.

15. A spin valve magnetoresistive (SVMR) sensor element with an enhanced magnetoresistive coefficient comprising:

a substrate;

a double-layer seed layer formed over the substrate, said double layer comprising a first material layer selected from the group of magnetoresistive (MR) resistivity sensitivity enhancing material consisting of nickelchromium alloys and nickel-iron-chromium alloys and said double-layer seed layer further comprising a second material layer, said material layer being a thin, non-magnetic dielectric nickel oxide material layer that additionally enhances magnetoresistive (MR) resistivity sensitivity;

a free ferromagnetic layer formed over the double-layer seed layer;

a non-magnetic conductor spacer layer formed over the free ferromagnetic layer;

a pinned ferromagnetic layer formed over the non-magnetic conductor spacer layer; and a pinning material layer formed over the pinned ferromagnetic layer.

16. The spin valve magnetoresistive (SVMR) sensor element of claim 15 wherein the nickel oxide material layer, which is the second material layer of said double-layer seed layer, is formed to a thickness of from about 5 to about 15 angstroms as a non-magnetic dielectric nickel oxide material layer.

17. The spin-valve magnetoresistive (SVMR) sensor element of claim 15 wherein the free ferromagnetic layer and the pinned ferromagnetic layer are each formed of a ferromagnetic material selected from the group consisting of nickel, iron and cobalt ferromagnetic materials, alloys thereof, laminates thereof and laminates of alloys thereof.

18. A magnetoresistive (MR) head having incorporated therein a spin-valve magnetoresistive (SVMR) sensor element in accord with claim 15.

19. The magnetoresistive (MR) head of claim 18 wherein the magnetoresistive (MR) head is selected from the group consisting of magnetoresistive (MR) read only magnetic heads, merged inductive write magnetoresistive (MR) read magnetic heads and non-merged inductive write magnetoresistive (MR) read magnetic heads.

20. A magnetic data storage enclosure having incorporated therein a magnetoresistive (MR) head in accord with claim 18.

* * * * *